United States Patent
Liu

(10) Patent No.: US 12,259,406 B2
(45) Date of Patent: Mar. 25, 2025

(54) ELASTIC ELECTRICAL CONTACT DEVICE AND CONTACT CONDUCTOR THEREOF

(71) Applicant: SUNLIT PRECISION TECHNOLOGY CO., LTD., New Taipei (TW)

(72) Inventor: Wen-Han Liu, Taipei (TW)

(73) Assignee: SUNLIT PRECISION TECHNOLOGY CO., LTD., New Taipei (TW)

( * ) Notice: Subject to any disclaimer, the term of this patent is extended or adjusted under 35 U.S.C. 154(b) by 146 days.

(21) Appl. No.: 18/115,778

(22) Filed: Mar. 1, 2023

(65) Prior Publication Data

US 2023/0280371 A1    Sep. 7, 2023

(30) Foreign Application Priority Data

Mar. 3, 2022 (TW) .................................. 111107689

(51) Int. Cl.
*G01R 1/067* (2006.01)
*H01B 5/00* (2006.01)

(52) U.S. Cl.
CPC ........... *G01R 1/06722* (2013.01); *H01B 5/00* (2013.01)

(58) Field of Classification Search
CPC ............................... G01R 1/06722; H01B 5/00
See application file for complete search history.

(56) References Cited

U.S. PATENT DOCUMENTS

| | | | |
|---|---|---|---|
| 6,194,908 B1* | 2/2001 | Wheel ................ | G01R 1/07328 324/763.01 |
| 8,808,037 B2 | 8/2014 | Park | |
| 9,797,925 B2* | 10/2017 | Teranishi ........... | G01R 1/06738 |
| 11,940,465 B2* | 3/2024 | Soma .................. | H01R 13/2421 |
| 2005/0162177 A1* | 7/2005 | Chou .................. | G01R 1/06761 324/755.02 |
| 2010/0327894 A1* | 12/2010 | Dang .................. | G01R 1/06738 324/755.11 |
| 2017/0229802 A1* | 8/2017 | Kazama ............. | H01R 13/2421 |
| 2020/0271691 A1* | 8/2020 | Shan .................. | G01R 1/06766 |
| 2024/0094250 A1* | 3/2024 | Wu ..................... | G01R 1/06722 |

* cited by examiner

*Primary Examiner* — Huy Q Phan
*Assistant Examiner* — Trung Q Nguyen

(57) ABSTRACT

An elastic electrical contact device and a contact conductor are introduced. The elastic electrical contact device includes two contact conductors. Each contact conductor includes a head and an electrical contact portion integrally connected with each other. The electrical contact portion has a cross section shaped as a curved bend and has a guide groove formed thereon. The electrical contact portion is bilaterally symmetrical along a second central axis, wherein a first central axis and the second central axis are parallel to each other and non-coaxial. The electrical contact portions of the two contact conductors are disposed to have openings thereof face each other and are mutually connected in respective guide grooves, are mutually slidable to extend and retract relative to each other, and are sleeved by an elastic reset member to enable the two contact conductors to be elastically reset when extending and retracting relative to each other.

6 Claims, 5 Drawing Sheets

ELASTIC ELECTRICAL CONTACT DEVICE AND CONTACT CONDUCTOR THEREOF

CROSS-REFERENCE TO RELATED APPLICATION

This non-provisional application claims priority under 35 U.S.C. § 119(a) on Patent Application No(s). 111107689 filed in Taiwan, R.O.C. on Mar. 3, 2022, the entire contents of which are hereby incorporated by reference.

BACKGROUND OF THE INVENTION

1. Field of the Invention

The present disclosure provides an elastic electrical contact device, and in particular to a device providing contact to test electrical characteristics and a contact conductor thereof.

2. Description of the Related Art

In package testing of semiconductor chips, for example, an electrical contact device for the testing needs to be installed on a test bench, and contacts on the semiconductor chips are contacted by heads of contact conductors so as to perform the testing (for example, using resistivity measurement as the basis for testing).

A conventional elastic electrical contact device has two contact conductors, which have pins face each other and are installed by using compression springs. The two contact conductors are compressible by the compression springs so as to be elastically extensible and retractable, and indirectly conduct electricity by means of coming into contact with the compression springs. However, since the two contact conductors are not directly connected by the pins during the installation but are coupled through the flexible compression springs, an issue of poor structural instability is resulted, further leading to pin kneeling due to frequently skewed contact conductors during testing. Moreover, the two contact conductors indirectly conduct electricity through the compression springs, and electrical conduction paths during conduction are lengthened because of the helical structures of the compression springs, hence producing unnecessary electrical loss.

In another conventional contact conductor structure, for example, the U.S. Pat. No. 8,808,037 B2, discloses an elastic electrical contact device formed by a flat contact conductor, in which trident-shaped connection bridges formed by means of stamping are formed at a body of the contact conductor to thereby provide two contact conductors with direct coupling and electrical conduction. However, the overall width of such contact conductor is in principle approximately 0.12 mm to 0.18 mm, and the widths of the individual connection bridges are merely between 0.04 mm and 0.06 mm. That is, the connection bridges have minute sizes that involve manufacturing and processing complexities and difficulties, and thus render a poor yield rate and mass production complications. In addition, the connection bridges also suffer from poor coupling instability issues even if having been manufactured. Moreover, since the contact conductor is flat in shape, it is difficult to further reduce the volume thereof under the premise of ensuring both good contact stability and good conductivity.

BRIEF SUMMARY OF THE INVENTION

With dedicated research and development, the applicant provides an elastic electrical contact device and a contact conductor thereof, in the aim of providing the contact conductor with better contact stability as well as good conductivity.

An elastic electrical contact device provided by the present disclosure includes:
- two contact conductors, integrally formed by means of stamping and identically structured, each of the contact conductors including:
  - a head, having a first front end and a first back end, the head being bilaterally symmetrical along a first central axis; and
  - an electrical contact portion, having a second front end and a second back end, the second front end and the first back end being integrally connected, the electrical contact portion having a cross section shaped as a curved bend and having a guide groove formed thereon, one side of the electrical contact portion having an opening provided along a lengthwise direction of the guide groove, the electrical contact portion being bilaterally symmetrical along a second central axis, the first central axis and the second central axis parallel to each other and non-coaxial, and the electrical contact portions of the two contact conductors disposed to have the openings face each other, being mutually connected in the respective guide grooves, and being mutually slidable to extend and retract relative to each other; and
- an elastic reset member, sleeving on the two contact conductors to at least cover the two electrical contact portions connected to each other, for the two contact conductors to elastic reset when extending and retracting relative to each other.

A contact conductor provided by the present disclosure is applicable to the elastic electrical contact device above, the contact conductor being integrally formed by means of stamping, and including:
- a head, having a first front end and a first back end, the head being bilaterally symmetrical along a first central axis; and
- an electrical contact portion, having a second front end and a second back end, the second front end and the first back end being integrally connected, the electrical contact portion having a cross section shaped as a curved bend and having a guide groove formed along the curve, one side of the electrical contact portion having an opening provided along a lengthwise direction of the guide groove, the electrical contact portion being bilaterally symmetrical along a second central axis, and the first central axis and the second central axis parallel to each other and non-coaxial.

In one embodiment, the electrical contact portion has a cross section that is U-shaped or C-shaped.

In one embodiment, a width of the electrical contact portion from the second front end to the second back end is constant.

In one embodiment, the opening has an equal-width portion and a dilated portion. The equal-width portion extends from the second front end to the second back end. The dilated portion is in communication with the equal-width portion at the second back end, and gradually dilates toward the second back end.

In one embodiment, the contact conductor includes a middle portion. The middle portion is integrally connected between the first back end and the second front end. The head and the middle portion are bilaterally symmetrical along the first central axis. The middle portion has a block portion projecting radially toward two sides relative to the first central axis, so as to block at two ends of the elastic reset member sleeving on the two contact conductors.

In one embodiment, the middle portion is connected on the same side as the head and the electrical contact portion, and the second front end of the electrical contact portion is connected to the middle portion on one side opposite to the opening.

In one embodiment, when the two electrical contact portions of the two contact conductors are connected to each other, the two first central axes are coaxial, and the two second central axes are located on two opposite sides of the first central axis and are equidistant therefrom.

Thus, the elastic electrical contact device and the contact conductor of the present disclosure are capable of providing better contact stability and good conductivity, and are readily to be mass produced. Moreover, sufficient electrical contact areas between the electrical contact portions can be provided by using smaller volumes, so that the volumes of the contact conductors can be further reduced.

DETAILED DESCRIPTION OF THE INVENTION

To facilitate understanding of the object, characteristics and effects of this present disclosure, embodiments together with the attached drawings for the detailed description of the present disclosure are provided.

Figure 1:
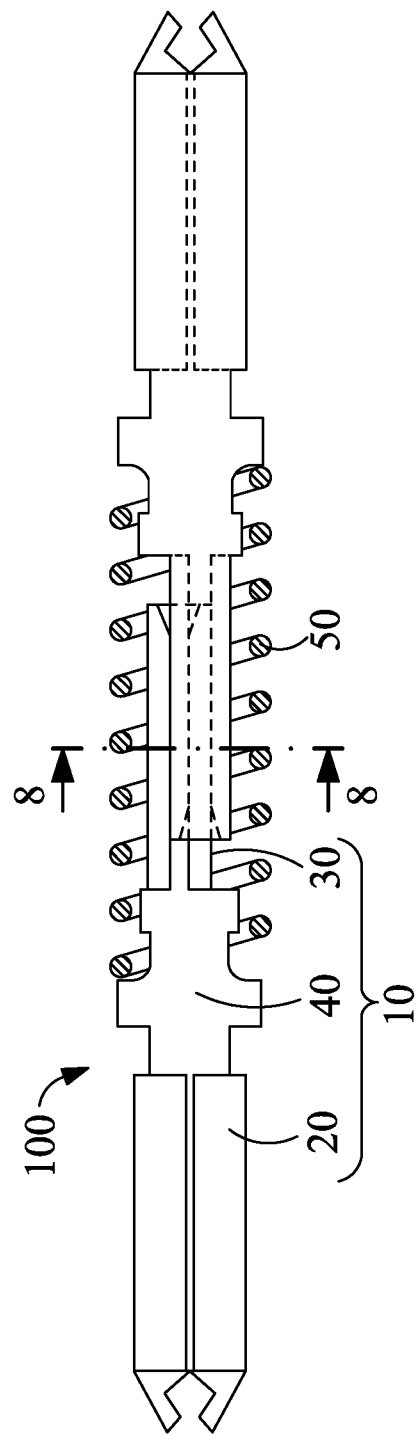
FIG. 1 is a plane view of installed members of an elastic electrical contact device according to an embodiment of the present disclosure in top view, wherein two contact conductors are pressed and hooked at an elastic reset member and thus inwardly retracted relative to each other.
Figure 7:
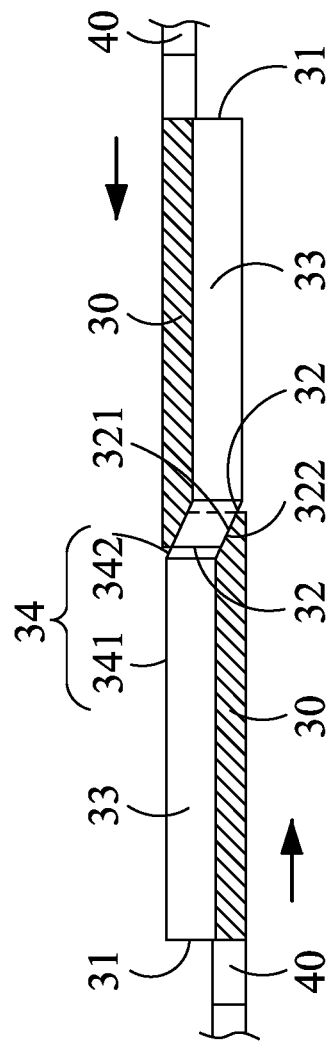
FIG. 7 is a section plane view of the two electrical contact portions connected to each other in FIG. 6, with a first central axis as a section position, and an elastic reset member omitted from the drawing.
Figure 8:
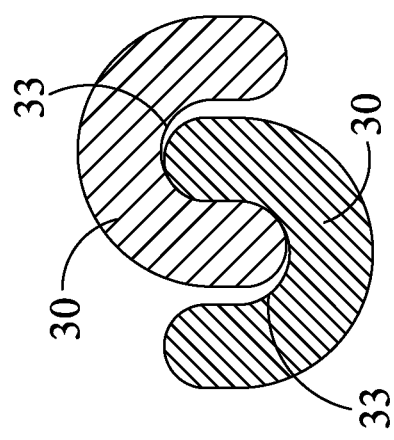
FIG. 8 is a section schematic diagram of electrical contact portions connected to each other along a section line 8-8 in FIG. 1.
Figure 9:
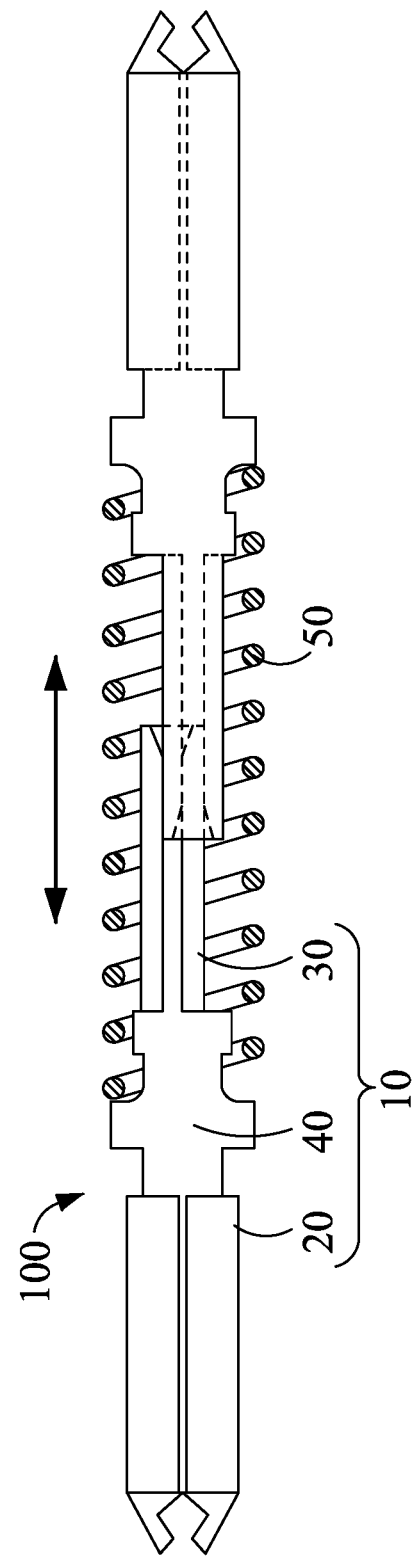
FIG. 9 is a schematic diagram of the two contact conductors in FIG. 1 being pushed by an elastic reset member and thus outward extending relative to each other.

Refer to FIG. 1 to FIG. 9. The present disclosure provides an elastic electrical contact device and a contact conductor, which are applied to package testing of semiconductor chips in one embodiment; however, the present disclosure is not limited to the application example above. The term "elastic electrical contact device" described in the present disclosure is also referred to as "contact probe" industry, and the term "contact conductor" defined in the present disclosure is different from the above "contact probe", and should be understood as one of the members forming the elastic electrical contact device. As shown in FIGS. 1 and 9, the elastic electrical contact device 100 includes two contact conductors 10 and an elastic reset member 50. The two contact conductors 10 are integrally formed by means of stamping and are identically structured.

Figure 2:
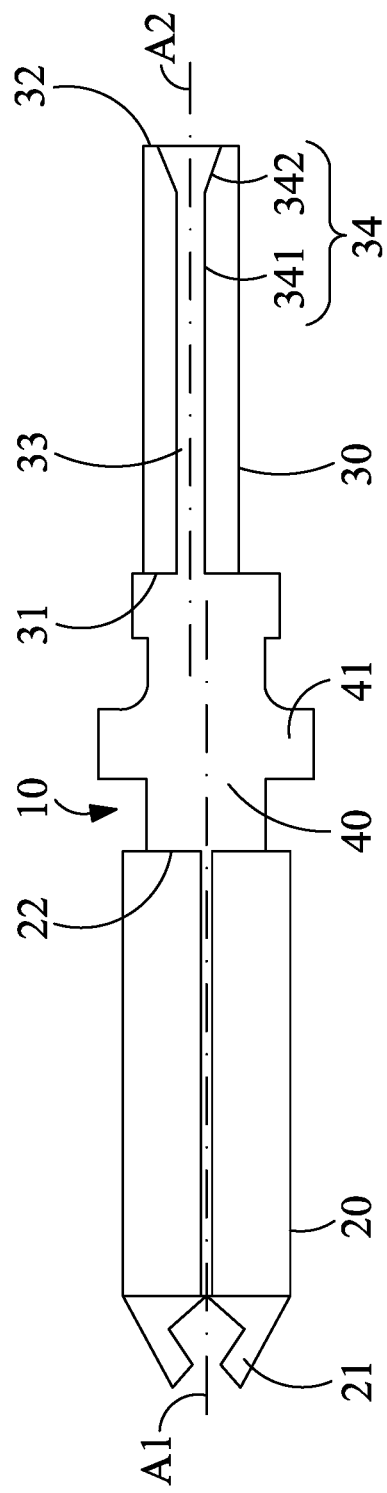
FIG. 2 is a plane view of a contact conductor according to an embodiment of the present disclosure in top view.
Figure 3:
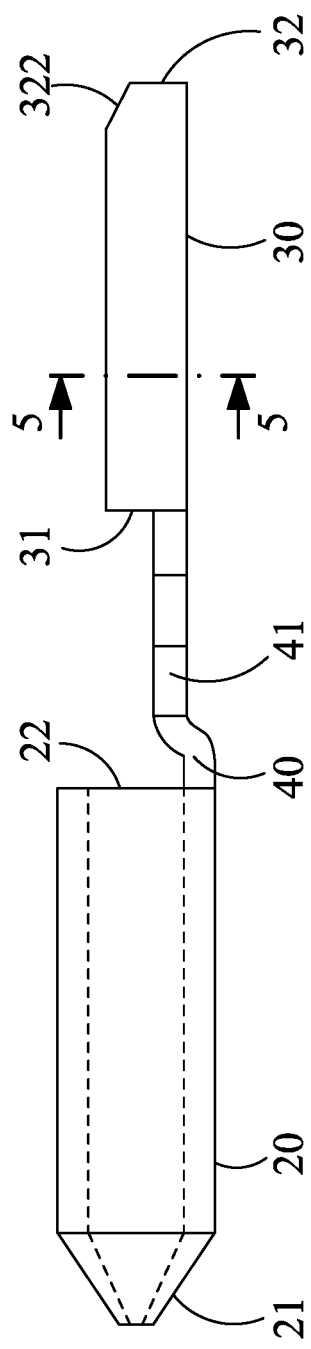
FIG. 3 is a plane view of a contact conductor according to an embodiment of the present disclosure in side view.

As shown in FIGS. 2 and 3, each of the contact conductors 10 includes a head 20 and an electrical contact portion 30.

Figure 4:
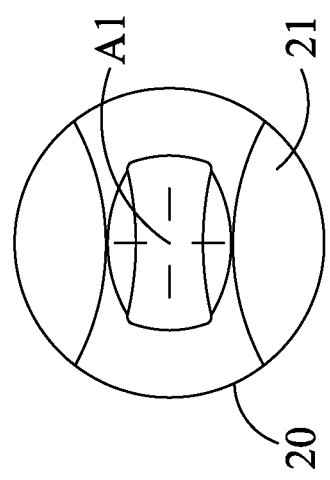
FIG. 4 is a plane view of a first front end of a head according to an embodiment of the present disclosure.

The head 20 has a first front end 21 and a first back end 22. Moreover, the head 20 is bilaterally symmetrical along a first central axis A1, and is shaped as a cylinder in one embodiment. The first front end 21 is a test end, and is used to contact a contact of a semiconductor chip so as to perform testing. In one embodiment, the first front end is shaped as a claw (as shown in FIG. 4) in one embodiment; however, the present disclosure is not limited to the example of a claw.

The electrical contact portion 30 has a second front end 31 and a second back end 32. The second front end 31 of the electrical contact portion 30 and the first back end of the head 20 are integrally connected. Moreover, as shown in FIGS. 2 and 3, the electrical contact portion 30 has a cross section shaped as a curved bend and has a guide groove 33 formed thereon. One side of the electrical contact portion 30 is provided with an opening 34, which is provided along a lengthwise direction of the guide groove 33. As shown in FIG. 2, the electrical contact portion 30 is bilaterally symmetrical along a second central axis A2, and the first central axis A1 and the second central axis A2 are parallel to each other and non-coaxial. That is, the center of the electrical contact portion 30 is offset from the centers of the head 20 and a middle portion 40.

Figure 5:
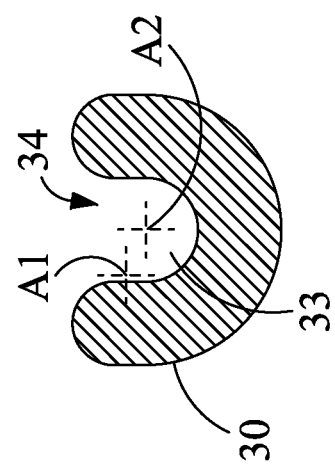
FIG. 5 is a section schematic diagram along a section line 5-5 in FIG. 3.

As shown in FIG. 5, the electrical contact portion 30 has a cross section that is U-shaped; however, the present disclosure is not limited to the example of the electrical contact portion 30 being U-shaped. For example, a C-shaped structure or a structure shaped as a curved bend and capable of providing the electrical contact portion 30 with mutual connection or mutual sliding is to be encompassed within the scope of protection of the present disclosure.

In one embodiment, the contact conductor 10 further includes the middle portion 40. The middle portion 40 is integrally connected between the first back end 22 of the head 20 and the second front end 31 of the electrical contact portion 30, and is also bilaterally symmetrical as the head 20 along the first central axis A1; that is, the head 20 and the middle portion 40 are both bilaterally symmetrical along the first central axis A1. As shown in FIG. 3, the middle portion 40 is connected on the same side as the head 20 and the electrical contact portion 30. Referring to FIG. 7, the second front end 31 of the electrical contact portion 30 is connected to the middle portion 40 on one side opposite to the opening 34; the opening 34 is located on an upper side of the electrical contact portion 30, and the middle portion 40 is connected to the second front end 31 on a lower side (one side opposite to the opening 34) of the electrical contact portion 30.

Figure 6:
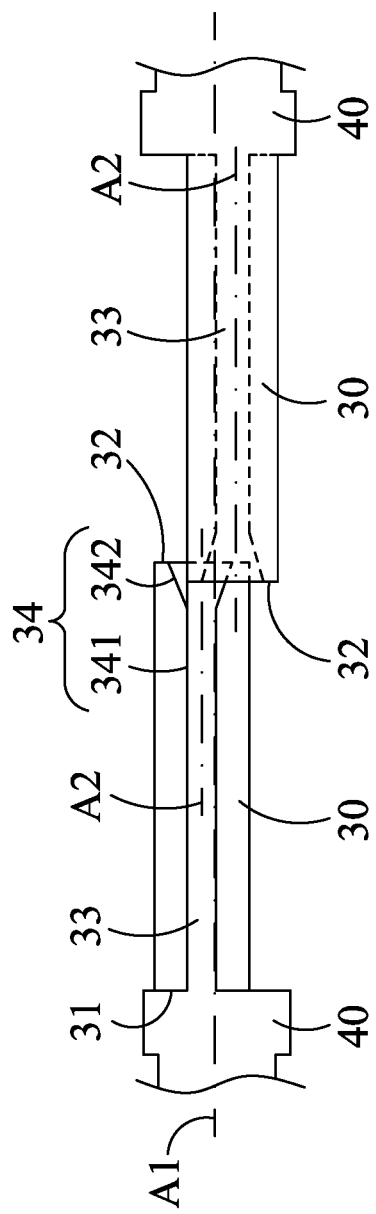
FIG. 6 is a plane view of two electrical contact portions connected to each other according to an embodiment of the present disclosure in top view, with an elastic reset member omitted from the drawing.

During installation of the elastic electrical contact device of the above embodiment, as shown in FIGS. 6, 7 and 8, the two electrical contact portions 30 of the two contact conductors 10 are placed to have the openings 34 face each other, and the guide grooves 33 connected to each other are mutually slidable to extend and retract relative to each other, wherein the electrical contact portions 30 are axially connection to each other. In one embodiment, when the two electrical contact portions 30 of the two contact conductors 10 are connected to each other, as shown in FIG. 6, the two first central axes A1 are coaxial, and the two second central axes A2 are located on two opposite sides of the first central axis A1 and are equidistant therefrom.

In one embodiment, a width of the electrical contact portion 30 from the second front end 31 to the second back end 32 is constant. The opening 34 has an equal-width portion 341 and a dilated portion 342. The equal-width portion 341 extends from the second front end 31 to the second back end 32. The dilated portion 342 is in communication with the equal-width portion 341 at the second back end 32, and gradually dilates toward the second back end 32. Moreover, the electrical contact portion 30 has an inner guide chamfer 321 and an outer guide chamfer 322 (as shown in FIG. 7) on the second back end 32. When the two electrical contact portions 30 are connected to each other, mutual guidance can be performed with the gradually dilating structure of the dilated portion 342, and the two electrical contact portions can be mutually guided by the abutting inner guide chamfer 321 and the outer guide chamfer 322 during the guidance, hence helping the two electrical contact portions 30 to be smoothly connected to each other.

As shown in FIGS. 1 and 9, the elastic reset member 50 sleeves on the two contact conductors 10 to cover the entire of two electrical contact portions 30 connected to each other and parts of the two middle portions 40, such that the elastic reset member 50 provides elastic reset when the two contact conductors 10 extend and retract relative to each other. In this embodiment, as shown in FIGS. 2 and 3, the middle portion 40 has a block portion 41 radially protruding toward two sides relative to the first central axis A1, so as to hook and block at two ends of the elastic reset member 50 when sleeving on the two contact conductors 10. However, the block portion 41 and the two ends of the elastic reset member 50 are not limited to being hooked and blocked in the present disclosure, and the block portion 41 may be structured as forming stopping on the two ends of the elastic reset member 50.

It is obvious from the above description, the present disclosure is characterized in that, the electrical contact portion 30 has a cross section shaped as a curved bend, and the first central axis A1 and the second central axis A2 are parallel to each other and non-coaxial. Thus, the width of the electrical contact portion 30 may be less than the width of the head 20 and/or the middle portion 40 (referring to FIGS. 1 and 2). In comparison to the conventional flat-shaped contact conductor structure, when the electrical contact portions 30 of the two contact conductors 10 are mutually connected in the respective guide grooves 33, the electrical contact portions 30 can come into contact with each other through the cross sections shaped as curved bends to provide sufficient electrical contact areas, thereby accomplishing effects of providing better contact stability and good conductivity under the premise achieving reduced volumes of the contact conductors 10. Moreover, the electrical contact portions 30 having the cross sections shaped as curved bends can be more easily manufactured to thereby render better yield rate and facilitate mass production. In addition, the volumes of the contact conductors 10 can also be reduced, further reducing volume and lowering material costs.

The present invention is described by way of the preferred embodiments above. A person skilled in the art should understand that, these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. An elastic electrical contact device, comprising:
    two contact conductors, integrally formed by means of stamping and identically structured, each of the contact conductors including:
    a head, having a first front end and a first back end, the head being bilaterally symmetrical along a first central axis; and
    an electrical contact portion, having a second front end and a second back end, the second front end and the first back end being integrally connected, the electrical contact portion having a cross section shaped as a curved bend and having a guide groove formed thereon, one side of the electrical contact portion having an opening provided along a lengthwise direction of the guide groove, the electrical contact portion being bilaterally symmetrical along a second central axis, the first central axis and the second central axis parallel to each other and non-coaxial, and the electrical contact portions of the two contact conductors disposed to have the openings face each other, being mutually connected in the respective guide grooves, and being mutually slidable to extend and retract relative to each other; and
    an elastic reset member, sleeving on the two contact conductors to at least cover the two electrical contact portions connected to each other, for the two contact conductors to elastic reset when extending and retracting relative to each other,
    wherein each of the contact conductors comprises a middle portion, the middle portion is integrally connected between the first back end and the second front end, the head and the middle portion are bilaterally symmetrical along the first central axis, and the middle portion has a block portion projecting radially toward two sides relative to the first central axis, so as to block at two ends of the elastic reset member sleeving on the two contact conductors.

2. The elastic electrical contact device according to claim 1, wherein the electrical contact portion has a cross section that is U-shaped or C-shaped.

3. The elastic electrical contact device according to claim 2, wherein a width of the electrical contact portion from the second front end to the second back end is constant.

4. The elastic electrical contact device according to claim 3, wherein the opening has an equal-width portion and a dilated portion, the equal-width portion extends from the second front end to the second back end, the dilated portion is in communication with the equal-width portion at the second back end, and the dilated portion gradually dilates toward the second back end.

5. The elastic electrical contact device according to claim 1, wherein the middle portion is connected on a same side as the head and the electrical contact portion, and the second front end of the electrical contact portion is connected to the middle portion on one side opposite to the opening.

6. The elastic electrical contact device according to claim 1, wherein when the two electrical contact portions of the two contact conductors are connected to each other, the two first central axes are coaxial, and the two second central axes are located on two opposite sides of the first central axis and are equidistant therefrom.

* * * * *